United States Patent [19]
Charlton et al.

[11] Patent Number: 5,523,696
[45] Date of Patent: Jun. 4, 1996

[54] METHOD AND APPARATUS FOR TESTING INTEGRATED CIRCUIT CHIPS

[75] Inventors: Richard G. Charlton; George C. Correla, both of Essex Junction; Mark A. Couture, Milton; Gary R. Hill, Jericho; Kibby B. Horsford, Charlotte, all of Vt.; Anthony P. Ingraham; Michael D. Lowell, both of Endicott, N.Y.; Voya R. Markovich, Endwell, N.Y.; Gordon C. Osborne, Jr., Essex Junction, Vt.; Mark V. Pierson, Binghamton, N.Y.

[73] Assignee: International Business Machines Corp., Armonk, N.Y.

[21] Appl. No.: 163,452

[22] Filed: Dec. 7, 1993

Related U.S. Application Data

[63] Continuation-in-part of Ser. No. 76,079, Jun. 14, 1993, abandoned.
[51] Int. Cl.[6] ............................ G01R 1/073; G01R 31/28
[52] U.S. Cl. ............................................. 324/758; 324/754
[58] Field of Search ........................... 324/158.1, 754, 324/757, 758

[56] References Cited

U.S. PATENT DOCUMENTS 5,367,253  11/1994  Wood et al. .................... 324/158.1

Primary Examiner—Ernest F. Karlsen
Attorney, Agent, or Firm—Thornton & Thornton; Lawrence Meier

[57] ABSTRACT

A method and apparatus for testing semi-conductor chips is disclosed. The individual semiconductor chips have I/O contacts. The apparatus is provided with an interposer that has contacts corresponding to the contacts on the semiconductor chip. Both the chip and the interposer contacts can be any known type including metal ball, bumps, or tabs or may be provided with dendritic surfaces. The chip contacts are first brought into relative loose temporary contact with the contacts on the interposer and then a compressive force greater that 5 grams per chip contact is applied to the chip to force the chip contacts into good electrical contact with the interposer contacts. Testing of the chip is then performed. The tests may include heating of the chip as well as the application of signals to the chip contacts. After testing the chip is removed from the substrate.

7 Claims, 13 Drawing Sheets

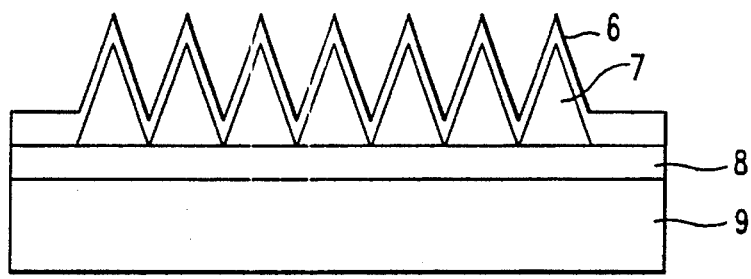

FIG. 1

```
┌─────────────────────────────┐
│ BRING A SEMICONDUCTOR       │
│ INTEGRATED CIRCUIT CHIP     │
│ HAVING A FIRST SET OF       │
│ ELECTRICAL CONTACTS INTO    │
│ ELECTRICALLY CONDUCTIVE     │
│ CONTACT WITH A BURN IN      │
│ BOARD CHIP TESTER HAVING    │
│ A SECOND SET OF             │
│ ELECTRICAL CONTACTS         │
└─────────────────────────────┘
              ↓
┌─────────────────────────────┐
│ APPLY A COMPRESSIVE FORCE   │
│ TO THE CHIP TO FORCE LOW    │
│ IMPEDANCE CONTACT BETWEEN   │
│ THE FIRST SET OF CONTACTS   │
│ ON THE CHIP AND THE SECOND  │
│ SET OF CONTACTS ON THE      │
│ BURN IN BOARD CHIP TESTER   │
└─────────────────────────────┘
              ↓
┌─────────────────────────────┐
│ PASS TEST SIGNAL INPUT      │
│ VECTORS TO THE SEMICONDUCTOR│
│ CHIP AND RECEIVE TEST       │
│ SIGNAL OUTPUT VECTOR FROM   │
│ THE CHIP                    │
└─────────────────────────────┘
              ↓
┌─────────────────────────────┐
│ APPLY A VACUUM TO THE       │
│ SURFACE OF THE CHIP REMOTE  │
│ FROM THE BURN IN BOARD      │
│ TESTER AND A POSITIVE       │
│ PRESSURE BETWEEN THE BURN   │
│ IN BOARD TESTER AND THE     │
│ CHIP TO REMOVE THE CHIP     │
│ FROM THE BURN IN BOARD      │
│ TESTER                      │
└─────────────────────────────┘
              ↓
┌─────────────────────────────┐
│ SEPARATE CHIPS THAT HAVE    │
│ PASSED FROM CHIPS THAT      │
│ HAVE FAILED                 │
└─────────────────────────────┘
```

FIG. 2

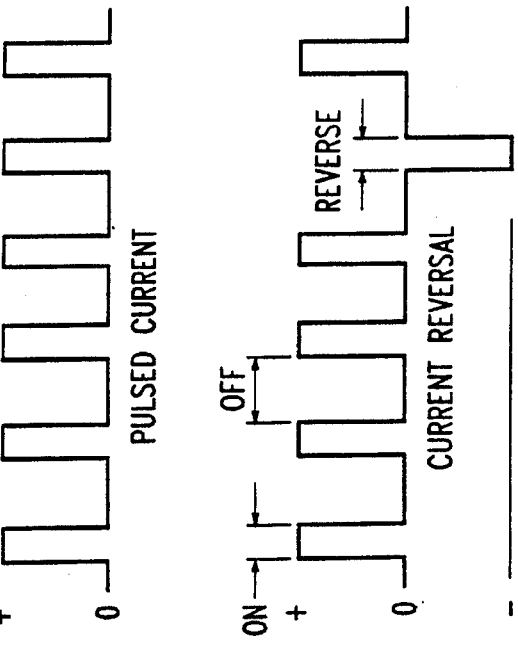
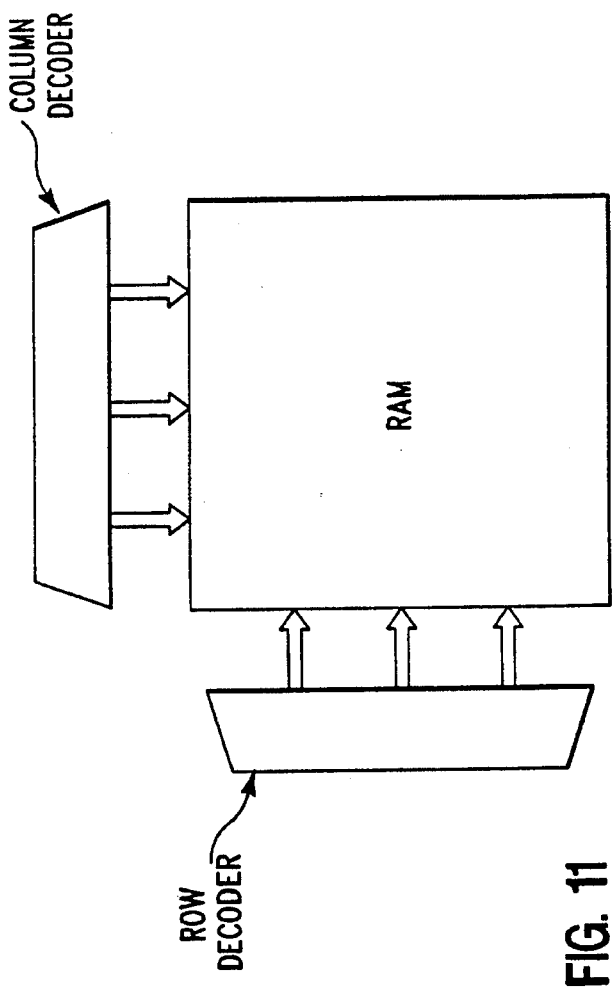
FIG. 11
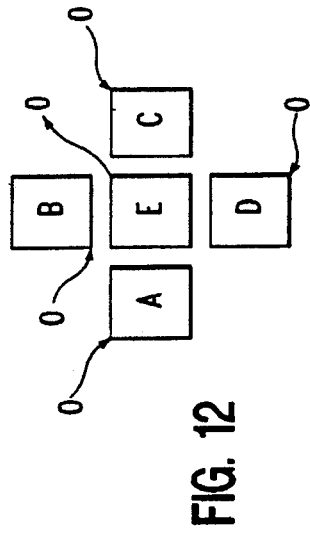
PASSIVE FAULT A=B=C=D=0=> E=0
FIG. 12
FIG. 14A
PRIOR ART
FIG. 14B
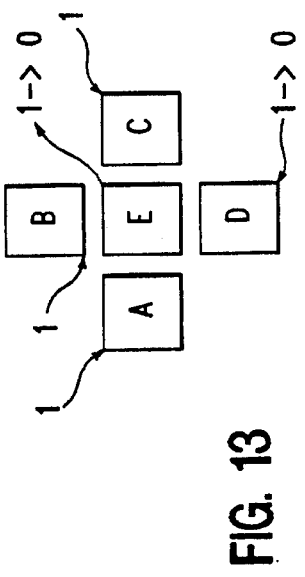
ACTIVE FAULT OR=> ER
FIG. 13

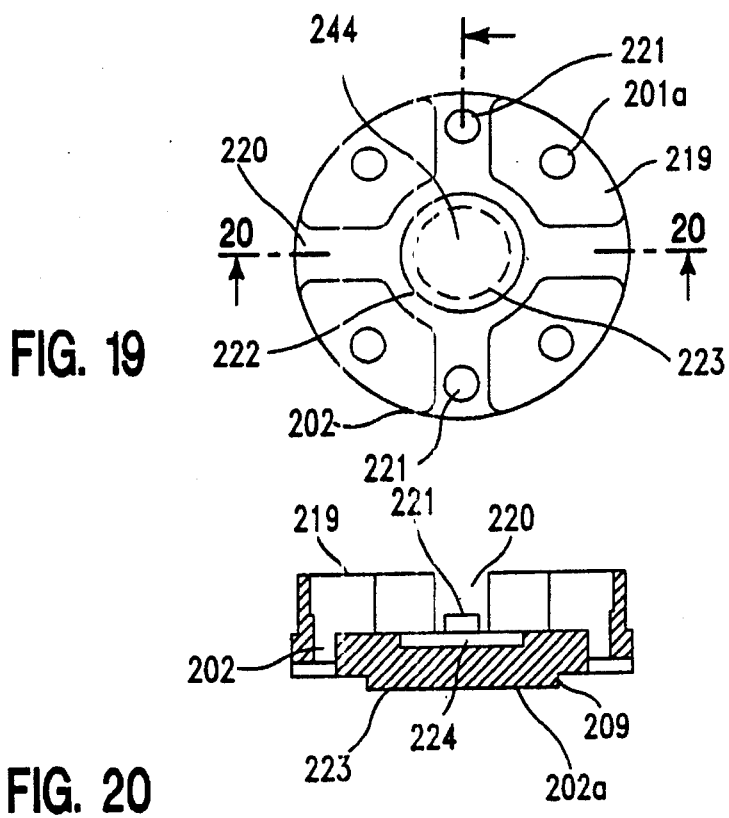
FIG. 19
FIG. 20
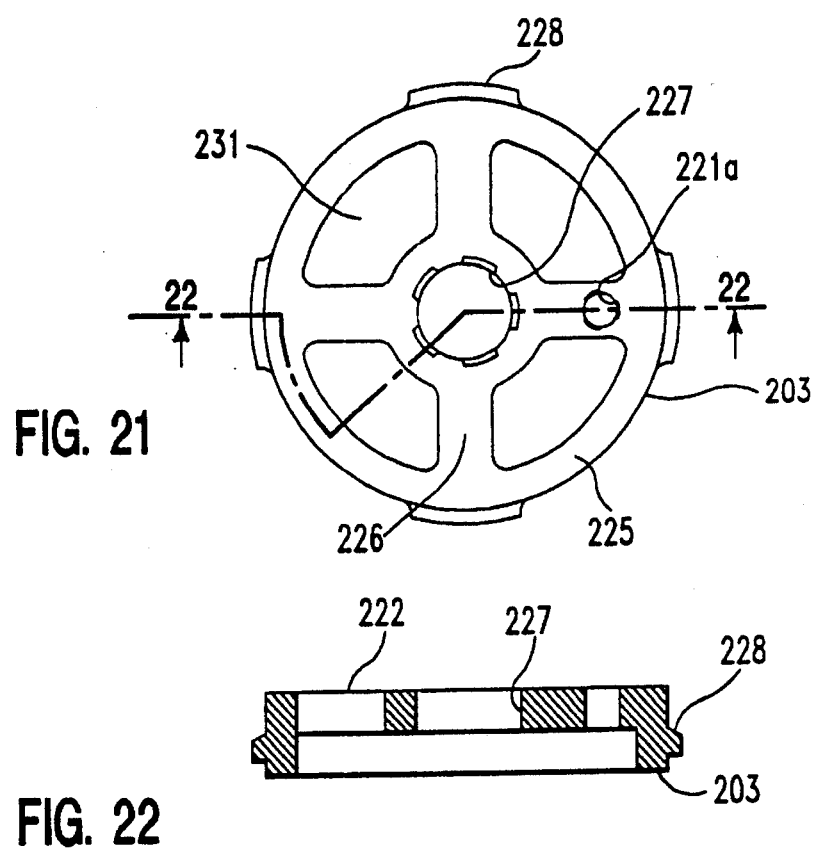
FIG. 21
FIG. 22

METHOD AND APPARATUS FOR TESTING INTEGRATED CIRCUIT CHIPS

RELATED INVENTION

This application is a continuation in part of application Ser. No. 08/076,079 filed Jun. 14, 1993, now abandoned.

FIELD OF THE INVENTION

The invention relates to integrated circuit chip testing. More particularly, the invention relates to a method and apparatus for testing individual semiconductor chips before they are permanently attached to a chip carrier, printed circuit card or the like.

BACKGROUND OF THE INVENTION

In the population of integrated circuit chip carriers, including thermally conductive modules, ceramic substrates, and polymeric substrates, it is necessary to minimize the shipment of modules with defective integrated circuit chips, while minimizing the cost of testing and replacement.

Integrated circuit chips are subjected to various wafer level tests during various stages of fabrication prior to dicing. However, after dicing it is particularly difficult and expensive to test integrated circuit chips. One reason is that an integrated circuit chip must be tested through its pins and contacts or pads before populating of the carrier, card, board, or the like.

Typically, integrated circuit chips are attached to a chip carrier, thermally conductive module chip carrier, circuit card or board, e.g., by solder bonding, brazing, controlled collapse chip connect, wire lead bonding, metal bump bonding, tape automated bonding, or the like.

The chip is then tested as part of an assembly and when a fault is found, the chip is removed from the card or board. This is not a simple "desoldering" step, especially in the case of high I/O density chips, encapsulation chip connect technologies, and multi-chip modules In these instances the defective chip is removed, the chip site redressed, and a new chip installed for testing. In the case of a polymeric substrate, redressing the chip site might include milling.
Dendritic Chip Testers.

"High Performance Test System", *IBM Technical Disclosure Bulletin,* Volume 33, No. 1A (June 1990), pp 124–125, describes a test system for ULSI integrated circuit memory and logic chips. In the described method, a first silicon wafer "test board" has metallization complementary to the metallization of the second silicon wafer to be tested. The second silicon wafer has C4 (controlled collapse chip connection) Pb/Sn solder balls on the contacts. The first and second silicon wafers have substantially flat and substantially parallel surfaces, and are said to require a minimum of compressive force for testing.

"New Products Test Interposer" Research Disclosure, January 1990, Number 309 (Kenneth Mason Publications Ltd., England) describes a method for fabricating an interposer-type test head to perform electrical testing of printed circuit cards and boards prior to component assembly. The test interposer is built as a mirror image circuit of the circuit to be tested. However, only the points to be tested, as lands and pads, are present. Circuit lines are not present. The test interposer pads are coated with a dendritic material to make electrical contact to the corresponding points on the printed circuit component to be tested. The circuit board or card and the tester are then brought into contact for testing.
Testers.

Compressive type testers are described generally in U.S. Pat. No. 4,716,124 to Yerman et al. for TAPE AUTOMATED MANUFACTURE OF POWER SEMICONDUCTOR DEVICES, U.S. Pat. No. 4,820,976 to Brown for TEST FIXTURE CAPABLE OF ELECTRICALLY TESTING AN INTEGRATED CIRCUIT DIE HAVING A PLANAR ARRAY OF CONTACTS, and U.S. Pat. No. 4,189,825 to Robillard et al. for INTEGRATED TEST AND ASSEMBLY DEVICE.

U.S. Pat. No. 4,189,825 to Robillard et al. for INTEGRATED TEST AND ASSEMBLY DEVICE describes a chip of the beam lead type with sharp points on the substrate leads and etched, conical holes in the semiconductor. The semiconductor and conical holes are metallized with a thin, conformal metal film, leaving conical openings in the metallization. These apertures correspond to the sharp points on the substrate leads. According to Robillard et al, the chips may be assembled and tested, with faulty chips removed and replaced before bonding. Bonding is by ultrasonic welding.
Dendritic Connections.

Dendritic connections are described in commonly assigned U.S. Pat. No. 5,137,461 of Bindra et al for SEPARABLE ELECTRICAL CONNECTION TECHNOLOGY. Bindra et al describe separable and reconnectable electrical connections for electrical equipment Bindra et al's connectors have dendrites characterized by an elongated, cylindrical morphology. These cylindrical dendrites are prepared by a high frequency, high voltage, high current density, pulse plating methodology utilizing a dilute electrolyte. Bindra et al describe the pulsed electro-deposition of Pd from a 10–150 millimolar Pd tetramine chloride, 5 molar ammonium chloride solution at 50 to 450 hertz and 200 to 1100 milliamperes per square centimeter in a pulse plating technique.

Electro-deposition of Pd dendrites is further described in European Patent 0054695 and U.S. Pat. No. 4,328,286 (European Patent 0020020)

U.S. Pat. No. 4,328,286 (European Patent 20020) to Crosby for ELECTROPLATING A SUBSTRATE WITH TWO LAYERS OF electrical contacts. The Pd coating is prepared by electro-depositing a first layer of Pd from an aqueous bath containing the cationic complex Pd $(NH_3)^{4++}$ and free ammonia with supporting anions ($Cl^-$, $Br^-$, $NH_2SO_3^-$, $NO_2^-$ and $NO_3^-$) and then electro-depositing a second Pd layer from an aqueous bath containing the anionic complex $Pd(NO_2)^{24-}$ with supporting cations.

Commonly assigned European Patent 54695 (published Jun. 30, 1982, granted Sep. 11, 1985, U.S. application Ser. No. 219,660 filed Dec. 24, 1980, now abandoned) discloses a method of preparing a Pd electrical contact by electro-deposition from a relatively dilute solution that is sprayed onto a cathode which is located completely outside and above the surface of the solution, which is located in a tank. The solution forms a continuous curtain falling from the bottom end of the cathode back into the tank. A higher electric current than usual is used in the deposition process. The dendrites obtained have a larger cross-section than those obtained in conventional processes.
Conclusion.

The art has failed to provide a means for rapid, reproducible, low cost, high throughput testing of integrated circuit chips.

OBJECTS OF THE INVENTION

It is an object of the invention to provide a method and apparatus for rapid, reproducible, low cost, high throughput testing of integrated circuit chips.

It is a further object of the invention to provide a method and apparatus for rapid, reproducible, low cost, high throughput testing of integrated circuit chips that allows for easy chip positioning and temporary attachment and easy removal of chips after testing, particularly after burn-in testing.

SUMMARY OF THE INVENTION

The invention provides a method of testing semi-conductor chips. The integrated circuit chips are placed in a test fixture by a special tool, tested in the test fixture under carefully maintained test conditions, and removed without damage.

The invention further provides a chip test fixture system. This chip test fixture system utilizes a test carrier (also required to herein as an "interposer") having contacts corresponding to the contacts on the semi-conductor chip. The carrier contacts have, for example, dendritic surfaces. The chip contacts which may, for example, be C4 solder balls, solder bumps, brazing alloy bumps, metal pads or bumps, as gold, silver, copper, or aluminum bumps or pads, wire lead connection pads, or tape automated bonding connection pads, are brought into compressive contact with the carrier contacts on the chip test fixture system. The compressive contact between the dendritic surface and the chip contacts provides a highly electrically conductive temporary bond. Test signal input vectors are applied to the inputs of the semiconductor chip across these highly electrically conductive bonds, and output signal vectors are recovered from the semiconductor chip across these highly conductive bonds.

The chip tester of the present invention substantially reduces the need for expensive rework. According to the method of the invention, there is provided a method of testing semi-conductor chips. The individual semiconductor chips have I/O, power, and ground contacts. In the method of the invention a test fixture system is provided. The test fixture system includes a dedicated fixture just for testing chips, a chip insertion tool, a chip positioning tool, and a chip removal tool. The functions of the individual tools, that is, the chip insertion tool, the chip positioning tool, and the chip removal tool, may be combined into a smaller set of tools. This chip test fixture system has contacts corresponding to the contacts on the semi-conductor chip. The carrier contacts are low electrical contact resistance contacts adapted for holding the integrated circuit chip in place during testing, with low impedance, while allowing easy removal of the chips after testing.

In one embodiment of the invention the test carrier contacts have dendritic surfaces. By dendrites are meant essentially vertical members extending outwardly from a generally planar area of electrically conductive material. The dendrites, produced by a columnar growth process, generally have an aspect ratio, of vertical to horizontal dimensions, of at least about 1.0, a height above the planar area of electrically conductive material of about 10 to 100 micrometers.

The chip contacts are brought into electrically conductive contact with the dendrite bearing contacts on the test carrier. A good electrically conductive contact must be a low impedance, low contact resistance contact, and the integrated circuit chip should be secured from lateral movement with respect to the substrate or fixture. Test signal input vectors are applied to the inputs of the semiconductor chip, and output signal vectors are recovered from the semiconductor chip. In the preferred embodiment of the invention, chip testing may be accelerated by heating the integrated circuit semi-conductor chip or chips under test.

After testing, the temporary bonds are broken without damage to the chip or chip contacts, and the chip is carefully removed from the test fixture and if faulty are discarded and if good permanently attached to a suitable substrate.

As used herein, "dendrites" are high surface area electrically conductive contacts formed of essentially vertical members extending outwardly from a generally planar area of electrically conductive material. The dendrites, produced by a columnar growth process, generally have an aspect ratio, of vertical to horizontal dimensions, of at least about 1.0, a height above the planar area of electrically conductive material of about 10 to 100 micrometers, a density (dendrites per unit area) of about 200 to 500 dendrites per square millimeter and a chip connect to dendritic contact resistance of about 3 to 5 milliohms.

The dendritic morphology is obtained by electroplating the underlayer under conditions that give rise to columnar growth, that is, very low cation concentration in the electrolyte, with electroplating being carried out at a high voltage, a high current, and a high current density. Preferably the electroplating current is a pulsed current. In another embodiment of the invention, the test carrier contacts are the contacts of an integrated probe. With this embodiment, which is designed for use with wire bond chips, the chip is initially held in contact with the test carrier contacts by a vacuum.

BRIEF DESCRIPTION OF THE DRAWINGS

The invention may be understood by reference to the following Figures together with the following description of the invention:

FIG. 1 is a representation of dendritic connectors, shown in cutaway view.

FIG. 2 is a flow chart of the method of the invention.

FIG. 11 is a circuit diagram of a RAM and decoder used to illustrate test vectors.

FIG. 12 is a representation of passive faults in a Random Access Memory (RAM) cell.

FIG. 13 is a representation of active faults in a Random Access Memory (RAM) cell.

FIGS. 14A and 14B show the voltage versus time plots for pulsed electroplating. FIG. 14A is a representation of the voltage versus time for the "on/off" electroplating method of the prior art.

FIG. 14B is a representation of the voltage versus time plot for the reversal method of a preferred embodiment of the invention herein.

FIG. 19 shows a top view of the lower heat sink of the device of FIG. 15.

FIG. 20 shows a sectional view of the lower heat sink of FIG. 17 taken along the lines 20—20.

FIG. 21 shows a top view of the body cover and internal gimbal thread of the device of FIG. 15.

FIG. 22 shows a sectional view of the body cover and internal gimbal thread of FIG. 21 taken along the lines 22—22.

DETAILED DESCRIPTION OF THE INVENTION

Figure 3:
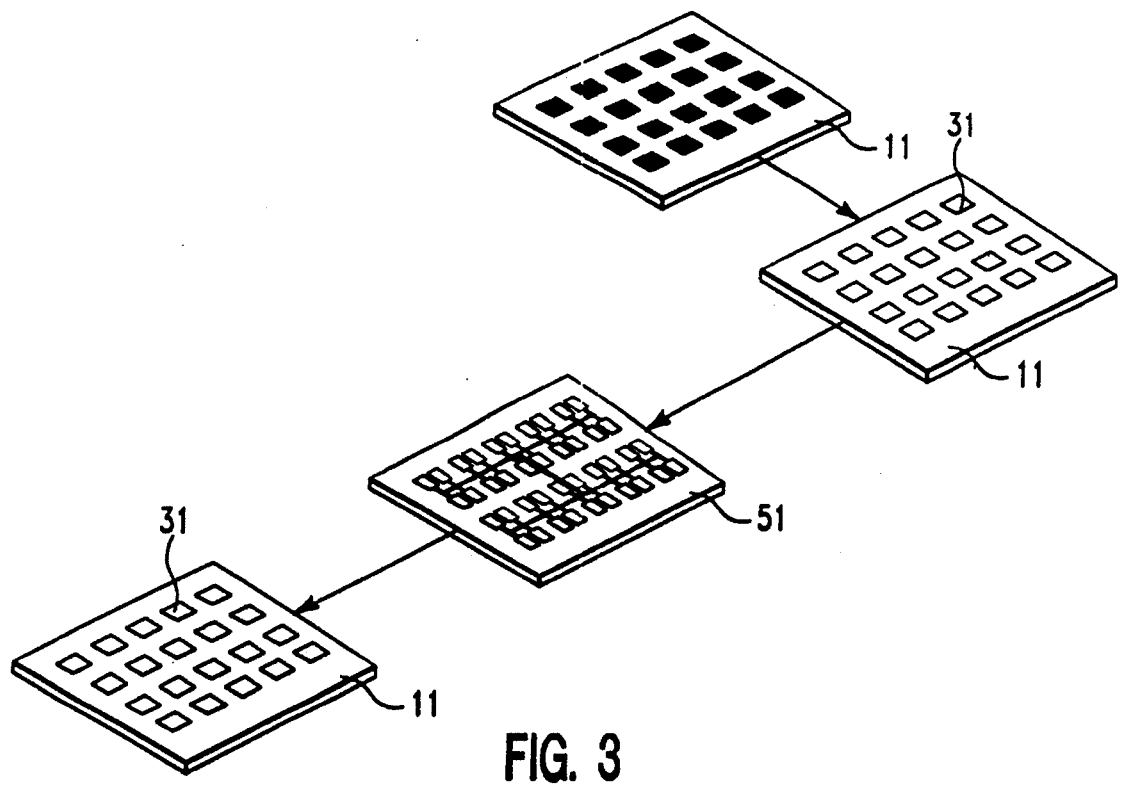
FIG. 3 is a schematic flow chart of the method of the invention, showing an overview of both the process and the system of the invention.

According to the method of the invention, there is provided a method of testing semiconductor chips. As used herein, "testing" includes elevated temperature testing, i.e., burn in, as well as ambient testing. In a preferred embodiment of the invention, there is provided apparatus for placing semiconductor chips in the test fixture system, positioning and holding the semiconductor chips before and during testing, and removing the semi-conductor chips after testing. The individual semi-conductor chips have I/O, contacts. In the method of the invention a chip test fixture system is provided. The test fixture system includes a burn in board or interposer with contacts which are aligned with the chip contacts, a means for placing the integrated circuit chips on the burn in board, a means for applying heat, a means for applying compressive force to the integrated circuit chips under test to form a good electrical contact between the chip contacts and the interposer contacts, and a means for removing the integrated circuit chips from the burn in board after completion of the test.

The burn in board of the integrated circuit chip test fixture system has contacts corresponding to the contacts on the semiconductor integrated circuit chip. These burn in board contacts may have electrically conductive surfaces, such as columnar dendritic surfaces or polymer core conical connector surfaces.

The chip contacts are brought into electrically conductive contact with the conductor contacts on the burn in board of the test system. In the case of flip chip connector chips, the chips are tested in their normal, contact down, configuration. Chips intended for other mounting technologies, with their contacts facing up, as tape automated bonding chips or wire lead connector chips, can also be mounted for testing in an inverted configuration, with their contacts facing downward. Test signal input vectors are applied to the inputs of the semiconductor chip, and output signal vectors are recovered from the semiconductor chip.

After testing the chip may be removed from the substrate.

According to a preferred exemplification of the invention there is provided a method and apparatus for testing an integrated circuit semi-conductor chip. The chip has a first plurality of I/O contacts providing signal, power, and ground contacts. These contacts are typically chosen from the group consisting of solder, low melting point alloys having a melting point below 200 degrees Celsius, brazing alloys, or other conductive metals as gold, silver, copper, or aluminum, They may be in the form of solder bumps or balls, controlled collapse chip connector (C4) balls, and pads for wire lead bonding and tape automated bonding. Generally, the chip contacts are characterized as being a structure formed of a metallic material in which electrical contact resistance is reduced by abrasion or penetration by the tester contact.

The process of the invention starts by providing an integrated circuit chip test system having a special and unique burn in board or interposer card between a tester and the chip being tested. The board or card has a plurality of contacts corresponding to the plurality of contacts on the chip to be tested. The contacts on the burn in board are coupled to the tester and are provided with high surface area conductor surfaces. Exemplary are columnar dendrites of porous, columnar Pd atop a smooth Pd film.

The system includes fixtures for placing the integrated circuit semiconductor chip on the burn in board, applying a compressive force to the integrated circuit semiconductor chip, and removing the integrated circuit semiconductor chip from the burn in board at the conclusion of the test.

The system may, and preferably does, include one or more heating systems. For example, a resistance heater can be integral to and incorporated into the burn in board, as well as heating elements in the compressive means. These heating systems heat the semi-conductor chips under test. Heating the semiconductor integrated circuit chip under test accelerates incipient failures and also accelerates the testing process.

In conducting the tests the first plurality of contacts of the semi-conductor chip are brought into electrically conductive contact with the second plurality of contacts on the chip test fixture system. This is not a simple touching contact. This is a compressive contact to break through oxide films on the contacts, and to even temporarily bond or adhere the contacts.

The compressive force applied to the chip breaks through these oxides and results in low impedance, adherent contact between the first plurality of contacts on the integrated circuit semiconductor chip and the second plurality of contacts on the burn in board.

The functional test of the semiconductor integrated circuit chip includes passing test signal input vectors to the semiconductor chip and receiving test signal output vectors from the semiconductor chip, as will be described more fully hereinbelow.

After completion of the test it is necessary to apply a vacuum to the surface of the integrated circuit semiconductor chip remote from the burn in board and a positive pressure between the burn in board and the integrated circuit semiconductor chip, there being a standoff between the bottom of the chip and the top surface of the burn in board, to break the adhesion between the first plurality of contacts on the integrated circuit semiconductor chip and the second plurality of contacts on the burn in board. This makes it possible to remove the integrated circuit semiconductor chip from the burn in board.

After testing the chips that have passed are separated from chips that have failed. According to a further embodiment of the invention, "fast" chips can be separated from "slow" chips.

Dendrites.

Dendrites are high surface area connectors. They can be used as "pad on pad" connectors, and for chip burn in. Dendrites have the structure shown in FIG. 1, with (a) a electrically conductive pad or substrate 9, such as a Cu pad, (b) a "smooth" underlayer 8, such as a Pd underlayer, and (c) a porous overlayer 7, such as a porous Pd layer. Supporting the electrically conductive pad 9 can be a printed circuit board, a metallized ceramic, or a metal pad on a flexible circuit (not shown). The underlayer 8 can be a Pd thin film, e.g., a Pd layer direct current plated from a relatively concentrated electroplated bath. The overlayer 7 is a porous, columnar Pd layer, typically deposited from a dilute electroplating solution, with a pulsed, high voltage, high current, high current density electroplating solution. There may, optionally, be a gold or solder top coat layer 6, such as a Bi—Sn or Pb—Sn layer, atop the porous Pd overlayer 7 for bonding.

The dendritic morphology is obtained by electroplating the underlayer 8 under conditions that give rise to columnar growth, that is, very low cation concentration in the electrolyte, with electroplating being carried out at a high voltage, a high current, and a high current density. Preferably the electroplating current is a pulsed current. In the case of a particularly preferred embodiment of the invention the plating current is pulsed positive and negative.

The dendritic surface is prepared by first electroplating the smooth Pd underlayer 8, referred to in the electroplating as a shiny or reflective plate, onto the Cu substrate 9. This smooth Pd underlayer 8 is deposited from a relatively concentrated Pd electroplating solution, containing about 100 or more millimoles of Pd or more, at a low current density of about 50 to 100 milliamperes per square centimeter or lower.

The columnar, porous Pd overlayer 7 is applied atop the Pd underlayer 8. This columnar, porous underlayer or coat is applied from a relatively dilute Pd electroplating solution having a Pd concentration of about 10–50 millimoles per liter in Pd (versus about 100 millimoles of Pd per liter for conventional electroplating)-Typical electroplating solutions include palladium tetra-amine chloride ammonium chloride, at a Ph of about 9 to 10. Typical pulsed electroplating programs include a ten to twenty percent duty cycle, and a current density of about 500 to 1000 Ma/cm$^2$.

While satisfactory results are obtained with a single phase pulsed current, as shown in FIG. 14A, and denominated "Prior Art," we have found that superior results are obtained with about 2.5 percent to about 25% voltage reversal with a two phase electroplating cycle, as shown in FIG. 14A. By "single phase" pulsed electroplating cycle, we mean an electroplating current that is pulsed to zero and positive values. By a "two phase" pulsed electroplating cycle we mean an electroplating current that is pulsed to zero and positive values and to zero and negative values, as shown in FIG. 14B.

One such pulse pattern that we have found particularly outstanding has the following characteristics:

| POSITIVE PULSE CONDITIONS | |
| --- | --- |
| Peak Current Density | 200–400 Amperes /ft$^2$ |
| Pulse Time On | 0.5 to 1.0 millisecond |
| Pulse Time Off | 2.0 to 9.0 milliseconds |
| Duty Cycle | 10% to 20% |
| Positive Direction Time | 20 to 40 seconds |
| REVERSE PULSE CONDITIONS | |
| Peak Current Density | 300 to 800 Amperes /ft$^2$ |
| Pulse Time On | 0.5 to 1.0 millisecond |
| Pulse Time Off | 2.0 to 9.0 milliseconds |
| Duty Cycle | 10% to 20% |
| Reverse Direction Time | 1 to 5 seconds |

Gold, solder (as Pb—Sn or Bi—Sn) or even a thin overcoat of Pd may be applied as topcoat 11 atop the dendrites formed thereby.

The resulting dendrites have a peak height of about 10 to 100 microns and a density (dendrites per unit area) of about 200 to 500 dendrites per square millimeter. Dendrites have a chip connect pad to dendritic pad contact resistance of about 3 to 5 milliohms.

While the invention has been described with respect to dendrites, it is, of course, to be understood that other connecting means may also be utilized on the substrate or fixture. One other type of connecting mans may be, for example, conical connectors as described in the commonly assigned U.S. Pat. No. 5,118,299 of Francis C. Burns, John J. Kaufman, David E. King, and Alan D. Knight, for CONE ELECTRICAL CONTACT, the disclosure of which is hereby incorporated herein by reference. Conical connectors are prepared by depositing an imagable polymeric material, as polyimide, and forming polymeric cones, as by laser ablation. The conical connectors are then coated, e.g., e.g., with a sputter chromium adhesion layer approximately 150 Angstroms thick, followed by sputter coating of a Cu layer approximately 10,000 to 100,000 Angstroms thick. A nickel coating approximately 0.1 to 1 mil thick is deposited atop the Cu, followed by a thin Au film.

Integrated Circuit Chip Burn In Test System

In a preferred exemplification of the invention the system includes:

1. A burn in board with dendritic contacts for connecting to C4 solder balls on one or more integrated circuit chips to be tested;
2. A heating assembly, preferably a time versus temperature programmable heating assembly, for heating the one or more integrated circuit chips being tested; and
3. Sub-systems for placing the integrated circuit chip or chips on the burn in board, and for removing the integrated circuits from the burn in board at the conclusion of testing.

It is, of course, to be understood that the heating assembly, the subsystem for inserting the integrated circuit chips, and the subsystem for removing the integrated circuit chips at the conclusion of testing can be one unit, fixture, tool, or element.

The burn in board has a plurality of individual contacts, pads, lands, or recesses for temporary electrical connectivity with integrated circuit chips. Each such pad, land, or recess has dendrites or cones, as described hereinbelow, to pierce the thin oxide layer on each facing contact of the integrated circuit chip, such as a Pb/Sn solder ball, and provide a low contact resistance electrical connection between the pad, land, or recess, and the contact on the integrated circuit chip.

The chips are manually or robotically located and placed on the burn in board so that each contact of each chip mates with a land, pad, or recess of the burn in board.

In one embodiment of the invention the heating assembly is aligned over the array of integrated circuit chips and lowered over the integrated circuit chips to cover the chips, apply heat to the chips, and apply a compressive force thereto. This application of pressure increases the heat transfer between the heating assembly and the chips, and reduces the electrical contact resistance between the integrated circuit chip contacts and the burn in board.

In a preferred exemplification the heating assembly has recesses for each integrated circuit chip. Each such recess has its sidewalls thermally insulated to prevent loss of heat from an individual chip to adjacent chips, thereby further increasing the severity of the test.

In a particularly preferred embodiment the burn in board itself can have integral heating means, whereby to heat the integrated circuit chips from both the top and bottom surfaces of the integrated circuit chip.

The temperatures may be monitored at each chip location, as well as at various other locations to control the thermal load on a chip.

FIG. 2 is a flow chart of the method of the invention.

FIG. 3 is a schematic flow chart of the method of the invention, showing an overview of both the general system and the process. An initially unpopulated burn in board 11 is populated with integrated circuit chips 31 by placing the chip contacts in contact with the burn in board contacts and heated by a heating assembly 51 applied over the integrated circuit chips 31 on the burn in board 11. The integrated circuit chips 31 are then tested electrically, logically, and thermally, as described hereinbelow. After testing the heating element 51 is removed from the integrated circuit chips 31 and the burn in board 11 and the integrated circuit chips 31 are separated therefrom and divided into defective chips and chips for placement on a printed circuit board, card, or other substrate.

Figure 4:
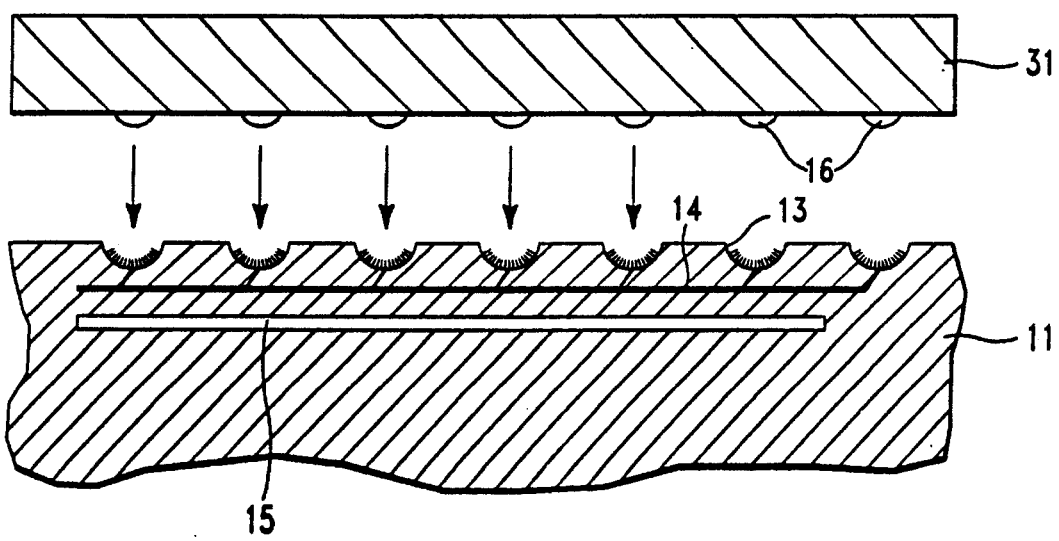
FIG. 4 is a partial cutaway view of the burn in board of the invention.

FIG. 4 is a partial cutaway view of the burn in board 11. This shows individual dendritic contacts 13 on the surface of the burn in board each of which are coupled to electrical lines 14 for applying test signals or vectors to individual contacts 16 on the integrated circuit chip. Also shown is an optional buried resistance heating means 15.

Figure 5:
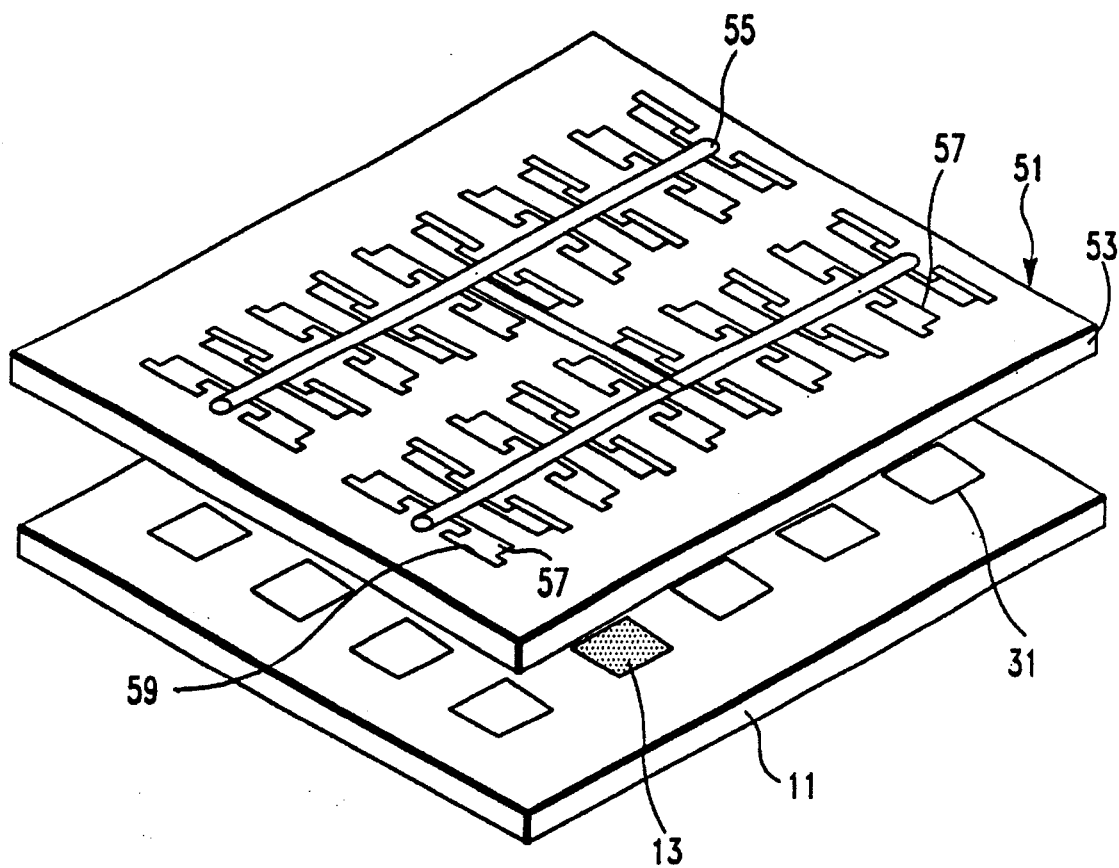
FIG. 5 is a perspective view of a heating assembly useful in the method and system of the invention.
Figure 6:
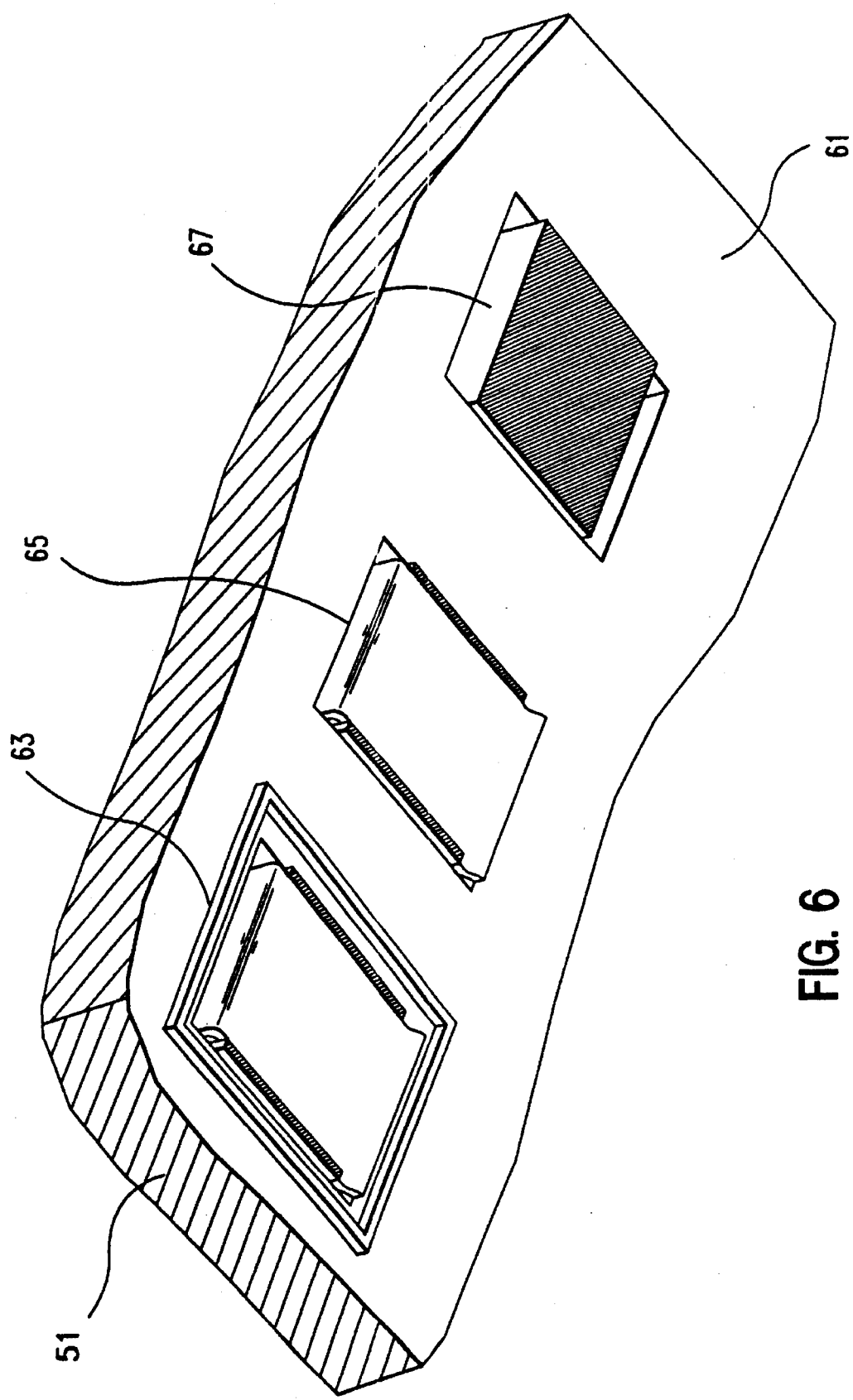
FIG. 6 is a perspective view of the bottom surface of the heating assembly shown in FIG. 5.

With reference to FIGS. 5 and 6 the heating assembly and board arrangement shown in FIG. 3 will be described. FIG. 5 is a exploded perspective view of the heating assembly 51 positioned over the populated burn in board 11. FIG. 6 is a perspective view of the bottom surface 61 of the heating assembly shown in FIG. 5.

In the embodiment shown in FIG. 5, the heating assembly 51 comprises a board 53 with a power cable 55, connected to individual feeder cables 57 which extend through slots 59 to heating elements 65 which are positioned atop the integrated circuit chips 31. As shown in FIG. 6 there is, in the bottom of the heating assembly, provided individual apertures 59 in which the individual integrated circuit chips 31 can nest. A heat frame 63 surrounds each aperture 59, with a conformal heater 65 wrapped around the walls of the aperture 57 and a conformal contact pad 67. The conformal contact pad 67 may be formed of a resilient material. Optionally the conformal pad 67 may have heating means contained therein.

The testing process requires initial high pressure to break through oxide films on the contact surfaces and effect a low electrical resistance contact, as well as sustained high pressure to avoid oxide formation and loss of electrical contact surface area, thereby reducing contact resistance and providing good electrical interconnection between the burn in board 11 and the integrated circuit chips 31 under test. Moreover, it is essential that the integrated circuit chip be held in place with a predetermined and controllable force, for example a chip specific force, a test fixture specific force, or a test procedure specific force. Chip specific forces are determined by the number and type of input/output (I/O) contacts on the integrated circuit chip being tested. Generally it has been found, that when solder balls and the like are to contact the above described dendrites, an applied force of between 10 and 50 grams per chip contact provides satisfactory results. This translates in to a force of about 30 pounds per square inch for a chip having 350 contacts and 110 pounds per square inch for a chip having 1900 to 2000 contacts. When the chip is only provided with wire bond pads the required applied force may be reduced to between 5 to 25 grams per pad and still achieve satisfactory results.

Thus it is necessary to apply force to the load bearing surfaces opposite the electrical contact surfaces of the integrated circuit chips 31 to both achieve good electrical contact between the burn in board contacts 13 and the chip contacts 16 before testing and to retain this good contact between the board contacts 13 and the chip contacts 16 during testing. This can be accomplished an integrated chip retention fixture. One such fixture is shown in FIGS. 7A and 7B, while another such fixture is shown in FIGS. 8A and 8B.

Figure 7A:
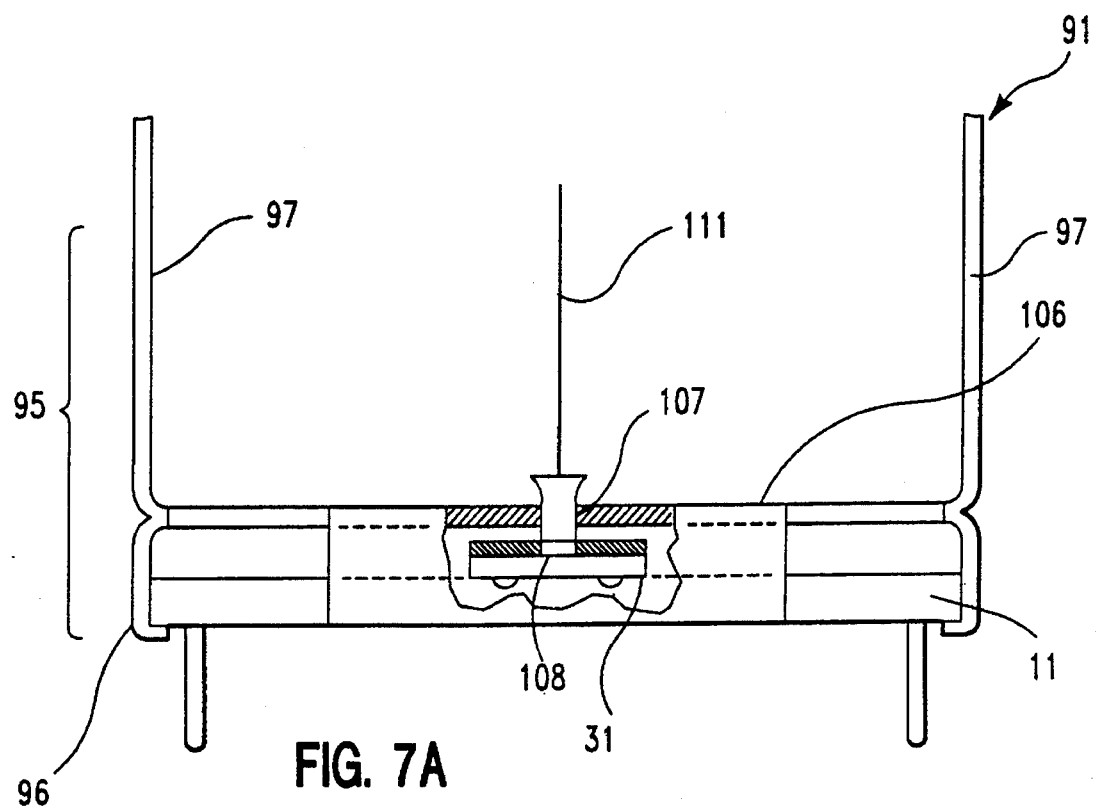
FIGS. 7A and 7B show one embodiment of a chip insertion and compression device useful in the system and method of the invention.
Figure 7B:
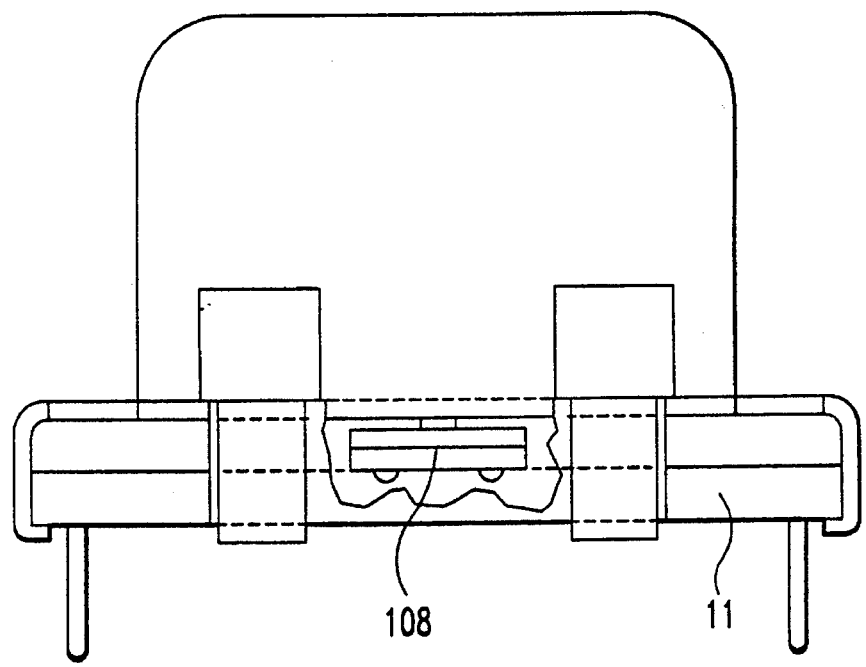
Figure 8A:
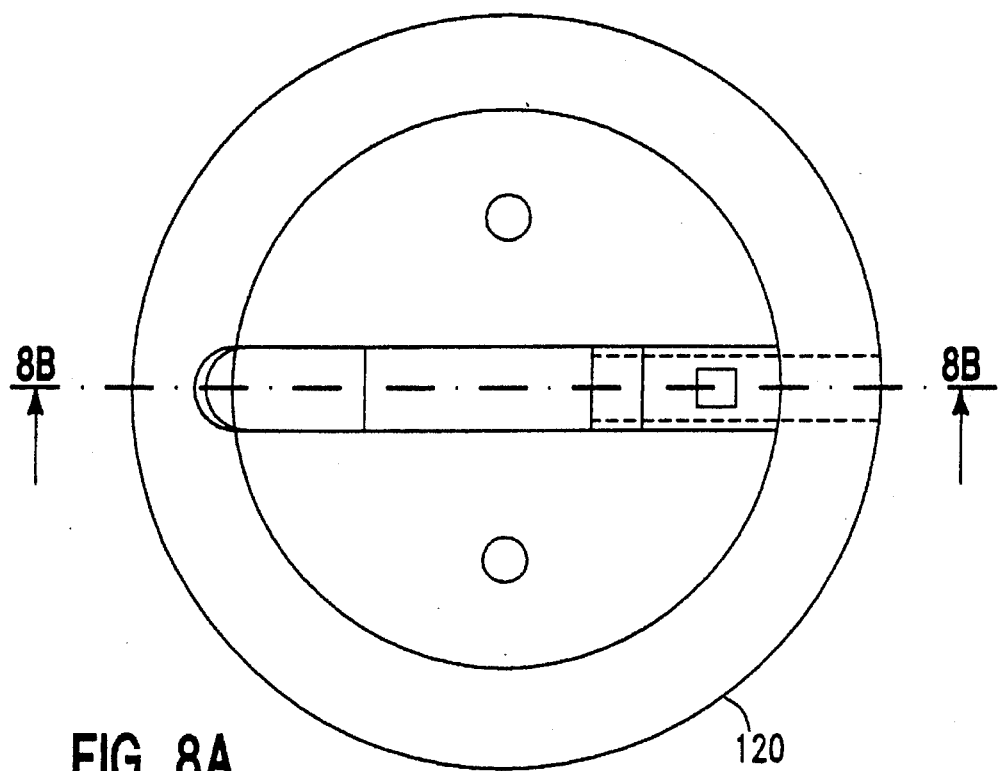
FIGS. 8A and 8B show an alternative embodiment of another chip insertion and compression device also useful in the system and method of the invention.
Figure 8B:
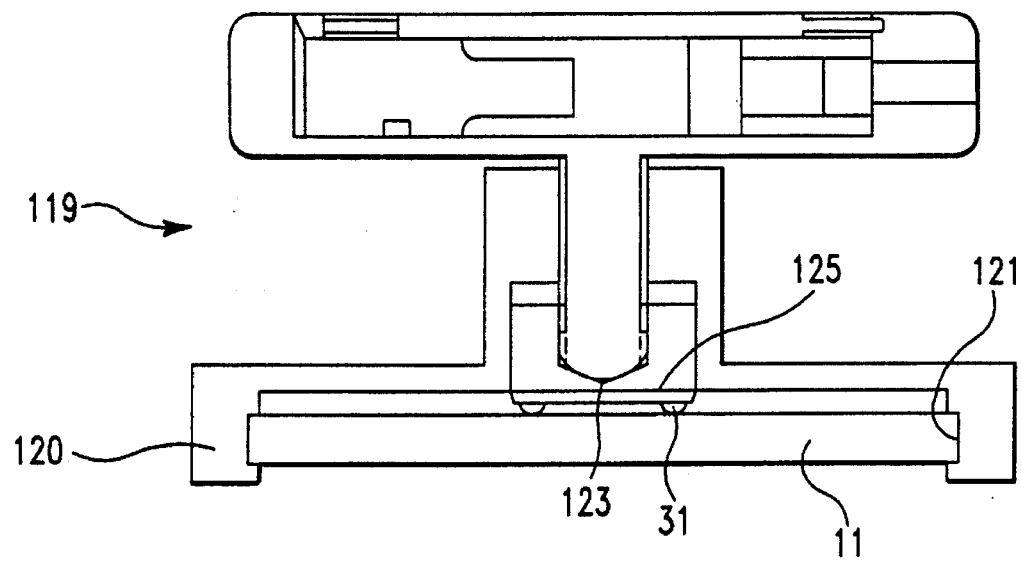

One type of chip retention fixture 91 for applying a non-variable, predetermined compressive force to the chips 31 under test is shown in FIGS. 7A and 7B. The amount of force is so applied can be determined by a weight or a spring. The fixture 91 is designed to align and retain the integrated circuit chip 31 on the burn in board 11, and apply force to the integrated circuit chip 31. The fixture 91 must of course be provided with means for placing and removing it on the burn in board 11.

The exemplification shown in FIGS. 7A and 7B has vertical side guides 95 to align the fixture 91 to the burn in board 11. The guides or tabs 95 are orthogonal to the burn in board 11. Spanning these guides and connecting them is a flexible beam 106 that carries a body portion 107. The beam 106 and body portion 107 apply a compressive force to the integrated circuit chip 31. The body portion 107 can be a foot, a weight, a chip swivel, or a piston, including a gas pressure driven piston, a spring driven piston, or a vacuum drawn piston.

The chip contacting face 108 of the body portion 107, for applying a compressive force to the integrated circuit chip 31, is flat, but can have a degree of movement to allow it to sit flat on the back of the integrated circuit chip 31, thereby applying force evenly to the integrated circuit chip 31.

Means for aligning the fixture 91 on the burn in board 11 and placing and removing the fixture 91 from the burn in board 11 can take various forms. FIGS. 7A and 7B show an embodiment where the lower portion of the side guides 95 are formed is "L" shaped retainer tabs 96 which lock to the bottom 12 of the burn in board 11 and the upper portion of the side guides 95 are extended load/unload actuators 97. These actuators provide the bending arm for opening the retainer tabs 96 to facilitate the placing and removing of the fixture 91.

An alternative fixture 119 is shown in FIGS. 8A and 8B. This design applies a continuous force to the back of the integrated circuit chip 31 or chips 31 under test. The base 120 of the fixture 119 shown in FIGS. 8A and 8B contains two retention slots 121 dimensioned to hold the burn in board 11. The upper portion 91 the fixture 119 permits the application of a controllably controlled compressive force by using a threaded shaft 123, with a flat end 125, that is provided in the lower body portion 120. The torque force is applied to the integrated circuit chip 31 or chips 31 under test with an adjustable torque limit system.

While the chip insertion and retention fixtures of FIGS. 7A, 7B, 8A, and 8B are shown as separate fixtures from the heating assembly of FIGS. 5, and 6, means for the controllable application of pressure to the integrated circuit chips 31 may be incorporated therein, with means for controllably applying pressure to the conformal heating pads 67. The means for applying pressure to the conformal heating pads 67 may be fixed pressure means, as shown in FIGS. 7A and 7B, or controllable pressure means as shown in FIGS. 8A and 8B, or even gas pressure and vacuum means as is described more fully hereinbelow.

Because, as noted above, the testing process requires initial high pressure to break through oxide films on the surface of the solder balls and contacts, as well as sustained high pressure to reduce contact resistance and provide good electrical interconnection between the burn in board and the integrated circuit chip, there may be adhesion of the integrated circuit chips 31 under test to the burn in board. Moreover, during testing thermal energy is both generated within the individual integrated circuit chips 31 and applied to the chips. This can, and frequently does, result in adhesion and even bonding of contacts between the individual integrated circuit chips 31 and the burn in board 11. In order to avoid damaging the individual integrated circuit chips 31, especially after the application of sufficient force thereto to break any oxide films on the surface of the solder balls or other interconnects, and the continued application of mechanical force, electrical energy, and heat, it is frequently necessary to use a special tool to remove the integrated circuit chips 31 from the burn in board 11.

Figure 9:
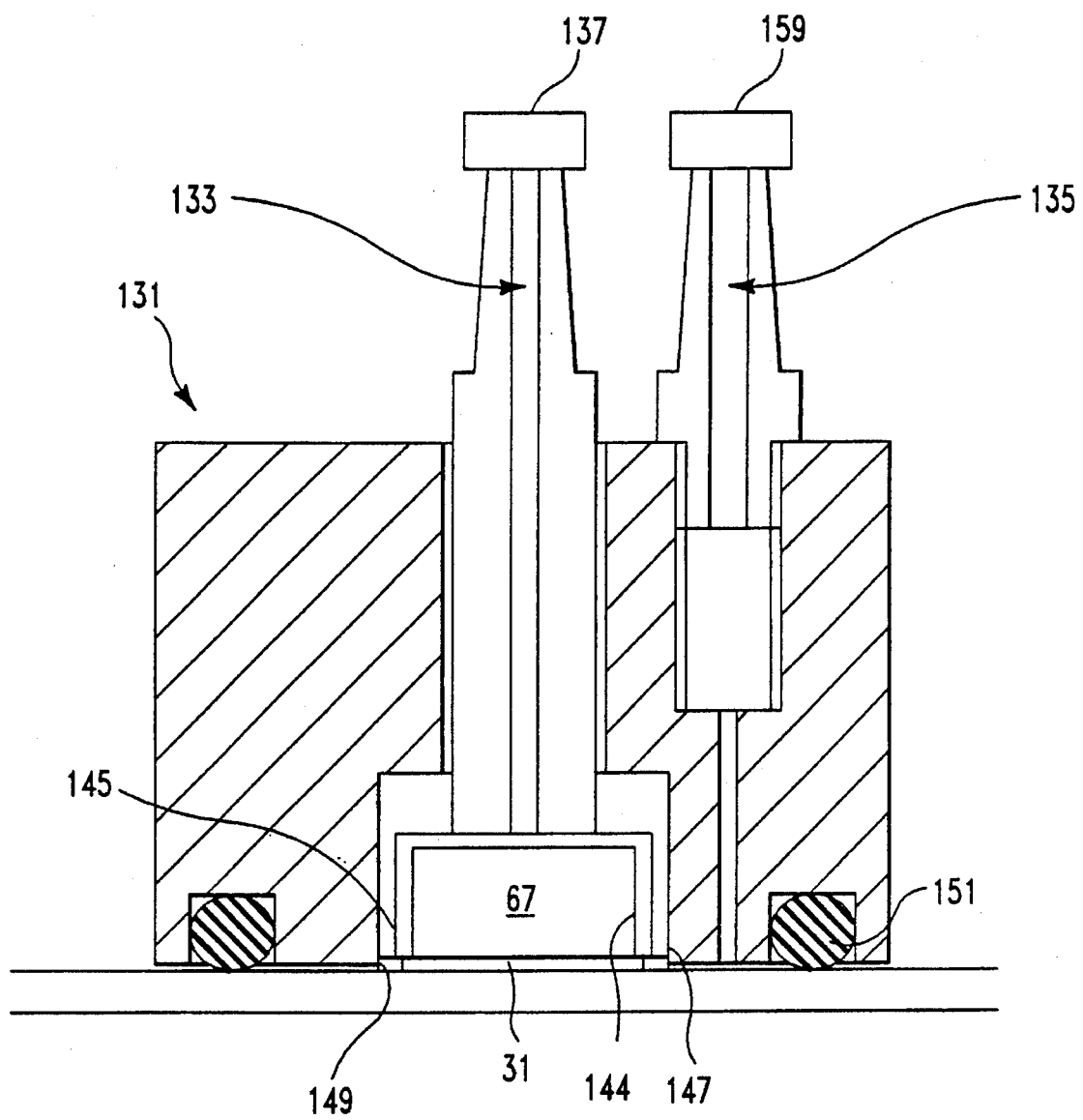
FIG. 9 shows a device for sequentially applying vacuum and pressure to remove an integrated circuit chip from a burn in board.

One such fixture is shown in FIG. 9. The device 131 is fabricated of a rigid material. The device has both an integral vacuum line 133 and an integral high pressure line 135, communicating to external vacuum and pressure sources, 137 and 139 respectively, optionally through movable inserts 141 and 143 respectively. The tool 131 has a vacuum recess 145 with an outer perimeter 147 larger then the integrated circuit chip 31 and an inner recess 149 of smaller size, i.e., smaller length, and width, but greater height or depth, then the individual integrated circuit chip 31. An "0" ring 151 provides an outer seal around the integrated circuit chip 31.

Figure 10:
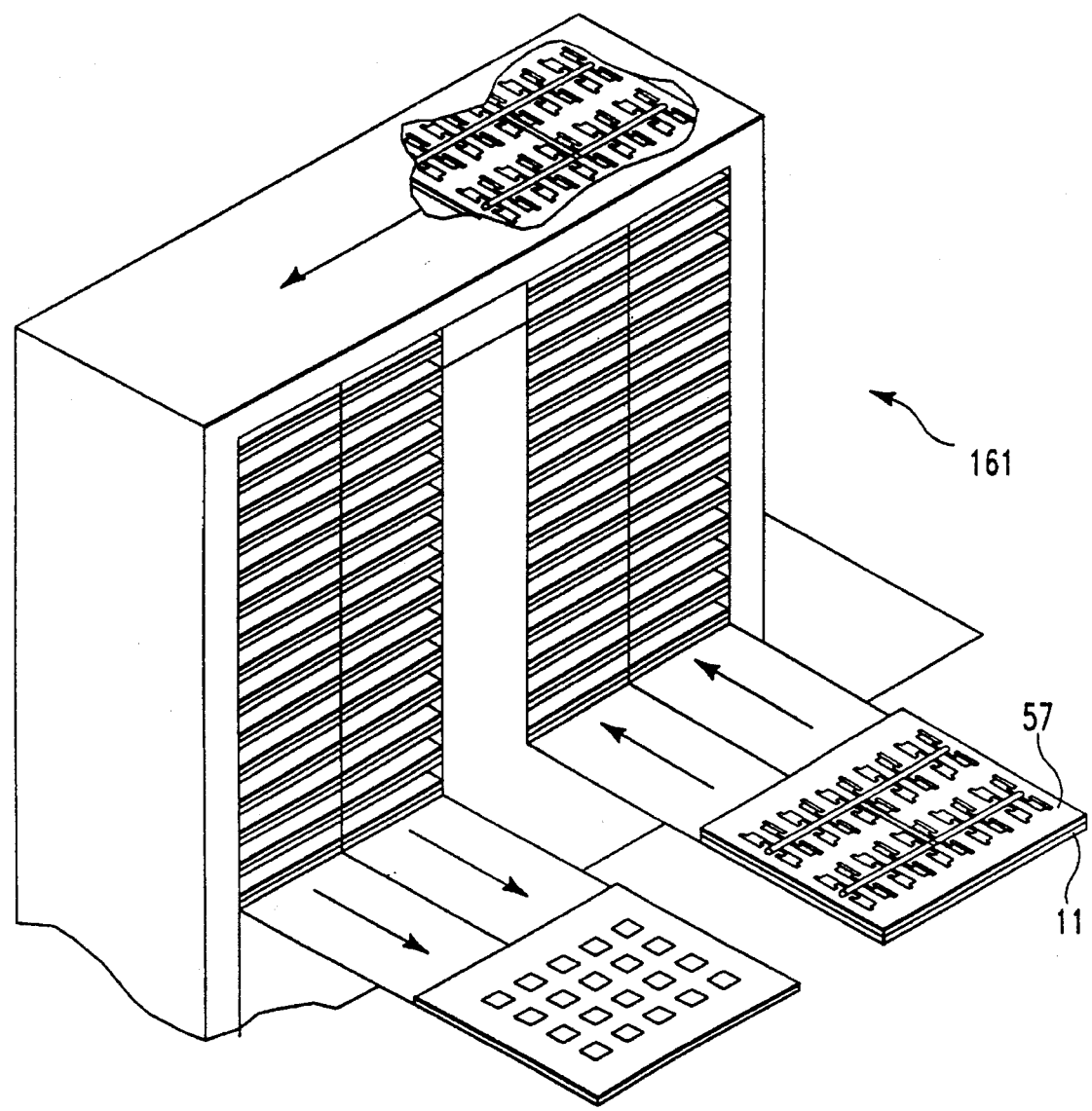
FIG. 10 shows a multiple burn in board.

FIG. 10 shows a perspective view of a further embodiment of the invention where a plurality of burn in boards are inserted in a large tester 161. The individual burn in boards 11 connect to connectors inside the container 161, while the individual heating elements 51 connect to separate higher wattage contacts (not shown).

Integrated Circuit Chip Test Procedures (Test Fixture)

FIG. 2 shows an overview of the general system and process. An initially unpopulated burn in board 11 is populated with integrated circuit chips 31. Each integrated circuit chip is tested substantially as shown in FIG. 2. In a preferred embodiment the chip contacts or connectors on the chip bonding surface are selected from the group consisting of solder, low melting point alloys having a melting point below 200 degrees Celsius, brazing alloy or conductive metals as gold, silver, copper, or aluminum. They may be in the form of controlled collapse chip connector (C4) balls, solder balls, or bumps or pads for wire lead bonding or tape automated bonding.

The burn in board fixture 31 has dendrites on the chip connect surfaces, contacts, or pads, substantially as described above. The chip 31 and burn in board 11 are brought into contact and a compressive force in the range described above is applied to the chip 31 placed in contact with the dendrite contacts 15 on burn in board 11. The above described compressive force of 10 to 50 grams per contact is sufficient to allow the dendrites to break through any oxide or corrosion films on the solder balls or C4 connectors on the chip. This provides direct, metal to metal contact, characterized by a contact resistance of less then 10 milliohms, and preferably less than 6 milliohms.

When the integrated circuit chip retention fixture 91 of FIGS. 7A and 7B is utilized, loading and removal can be either manual, semi-automatic, or fully-automatic, including robotic. Both placing and removing the fixture 91 includes squeezing the upper portions of the load/unload actuators 97 to force the burn in board retainer tabs 96 wide enough apart to clear the burn in board 11. Allowing the burn in board tabs 96 to return together locks the fixture 91 in place, and applies a compressive force to the integrated circuit chip 31 under test.

Loading and removing the alternative integrated circuit chip retention fixture of FIGS. 8A and 8B includes loading the burn in board 11 into the retention slots 121, and positioning the fixture 91 so that the pistons are directly above the integrated circuit chips 31 under test. After the fixture 91 is properly centered, the knurled detent head is turned clockwise until the pre-calibrated detent pin is released from its recess.

A heating assembly 51, which may also be incorporated in the compressive tool 91, is applied to the integrated circuit chips 31 on the burn in board 11 to provide electrical contact between the integrated circuit chips 31 and the contacts 13 on the burn in board 11. The chips are then tested electrically, logically, and thermally, as described hereinbelow.

Generally, in the testing process the integrated circuit chip is powered, e.g., between inputs of $V_{DD}$ or $V_{CC}$, and ground, and subjected to various logic and memory tests and to thermal loads. After testing the heating element 51, the chips 31 and the burn in board 11 are all separated. The individual integrated circuit chips are separated into defective chips, which are discarded and chips for placement on a printed circuit board, card, or other substrate.

As noted hereinabove, the testing process subjects the integrated circuit chip to compressive and thermal loads which, while necessary to break through oxide films on the surface of the solder balls and contacts, reduce contact resistance, and provide good electrical interconnection between the burn in board 11 and the integrated circuit chip 31, which can, and frequently do, result in adhesion and even bonding of contacts between the individual integrated circuit chips 31 and the burn in board 11. Thus, to avoid damaging the individual integrated circuit chips 31, it is may be necessary to use high pressure and vacuum tools to remove the integrated circuit chips 31 from the burn in board 11.

To remove an integrated circuit chip the tool 131 is positioned over the burn in board 11 with the recess 145 located over the integrated circuit chip 31. A vacuum is drawn over the chip 31, and a high pressure, e.g., about 10 to 50 or more pounds per square inch (gauge) is applied through the pressure line 135. The combination of vacuum applied to the top surface of the integrated circuit chip 31 and high pressure applied to the bottom of the integrated circuit chip 31, forces the chip upward from the burn in board 11 for easy removal.

The integrated circuit chip can have logic, memory or support circuitry thereon or combination of such circuitry and these chip may be tested for various defects as is well known to the art.

One such type of chip, i.e., a memory array, with column and row decoders is shown in FIG. 11.

Test that are typically performed on such chips include "cell Stuck", "no and multiple access faults" Passive pattern sensitive faults are faults such that a pattern of cell values prevents writing a value into a cell and may be tested for by using the present invention. A passive pattern sensitive fault pattern is shown in FIG. 12. In the FIG. the states of cells, A, B, C, and D determine the state of cell E, that is $A=B=C=D=0 \Rightarrow E=0$.

Active pattern sensitive faults occur when the change of value in one memory cell causes the value stored in another cell to change. An active pattern sensitive fault is shown in the FIG. 13, where the contents of cell D determine the contents of cell E. That is, $A=B=C \Rightarrow D,E$, but $D\uparrow \Rightarrow E\uparrow$.

Passive pattern sensitive faults are tested for by setting the contents of the adjacent memory cells, A,B,C,D from {0,1}, and setting the base cell, E, to $E=\uparrow$ and $E=\downarrow$, and reading the base cell, E. For a passive pattern sensitive fault, we expect the measured value of the contents of cell E to be a function of the contents of the surrounding cells, and not necessarily the value set by the testing program.

In testing for active pattern sensitive faults, we place fixed values in three of the four neighboring cells (i.e., three of the four cells, A,B,C, and D), and the base cell. We then transition the remaining neighbor cell, and see if this changes the contents of the base cell, E.

Testing for passive pattern sensitive faults requires~65 n tests, where n is the number of cells. Testing for active pattern sensitive faults requires~100 n tests, where n is the number of cells.

The above described tests and test procedures may be applied to an integrated circuit chip in an environment more severe then the environment where it is to function in service, along with actual fan-out and latency effects. This is a particular advantage over existing test procedures.

Turning now to FIGS. 15–24, further embodiments and variations of the chip insertion, placement and hold down compression fixture suitable for holding a chip on a burn in board or interposer card will be described. When an interposer card or test carrier is used it is provided with suitable contact means such as extended pins, leads or land grid arrays such that it can be plugged into a burn in board or a test head. In the present embodiment it will be assumed that an interposer card is used and that it will, during the actual test procedure, be plugged into a separate burn in board and the unified burn in board and the hold down compression fixture will be inserted in a suitable heating and testing oven. Such ovens are commercially available and well known to the art.

Figure 15:
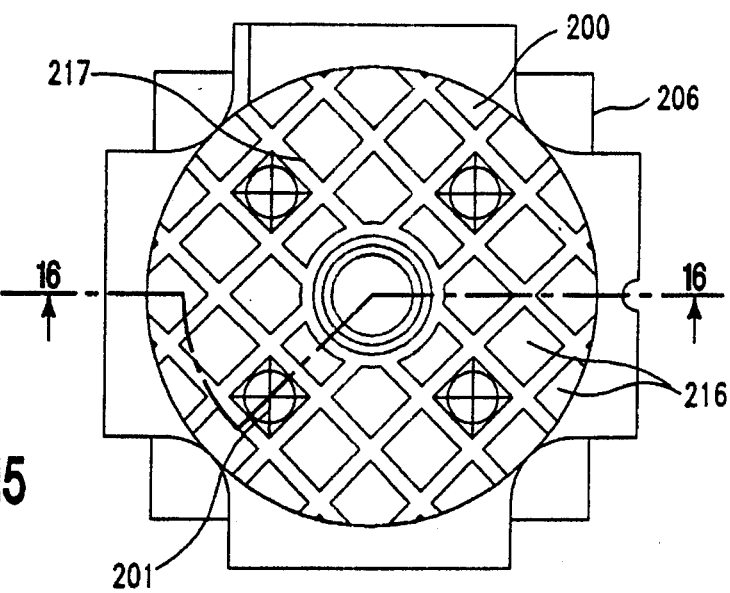
FIG. 15 shows a top view of yet another embodiment of a chip insertion and compression device also useful in the system and method of the invention.
Figure 16:
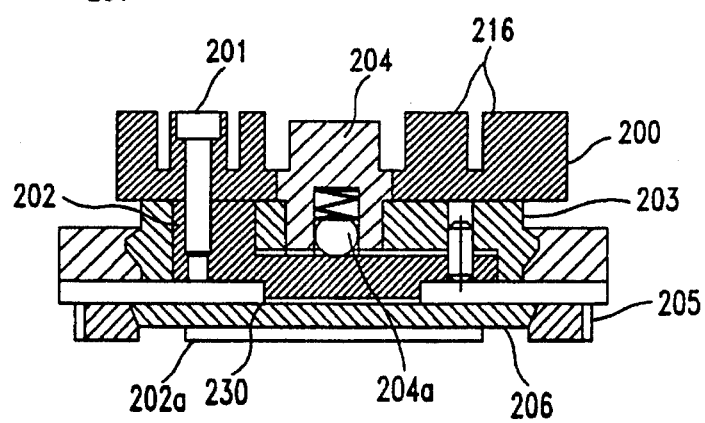
FIG. 16 shows a sectional view of the device of FIG. 15 taken along the lines 16—16.
Figure 17:
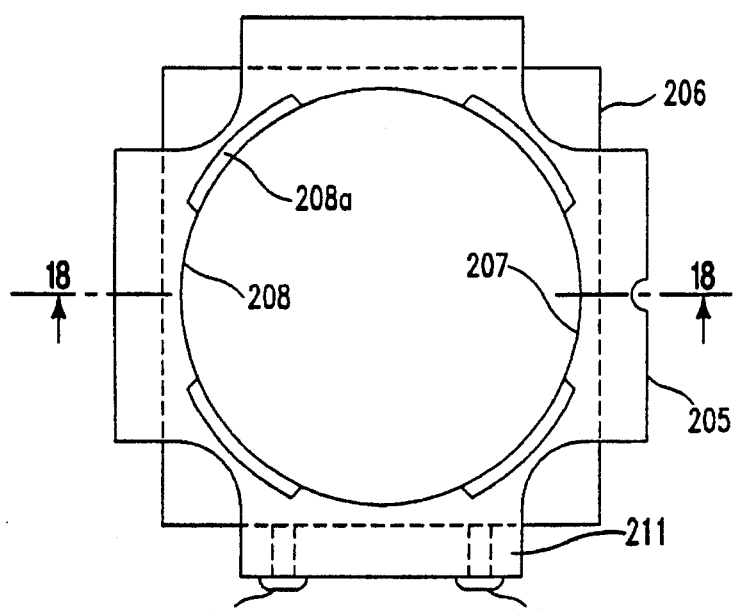
FIG. 17 shows a top view of the body fixture of the device of FIG. 15.
Figure 18A:
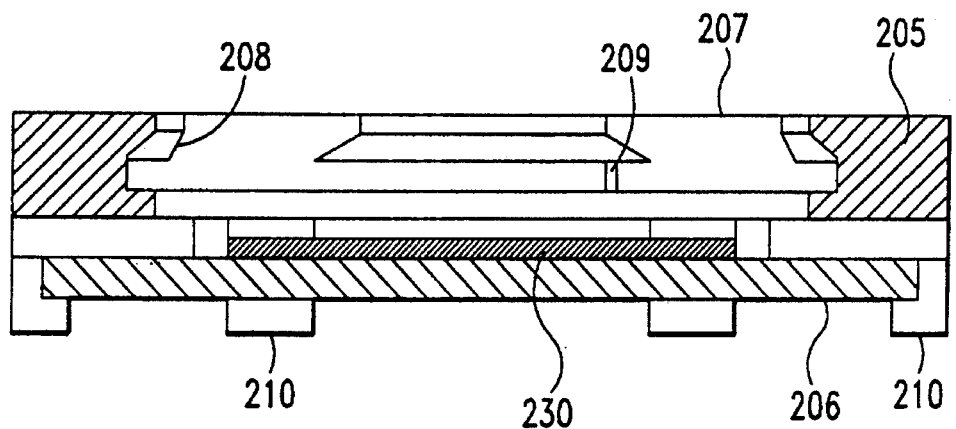
FIG. 18A shows a sectional view of the body fixture of FIG. 17 taken along the lines 18—18.
Figure 18B:
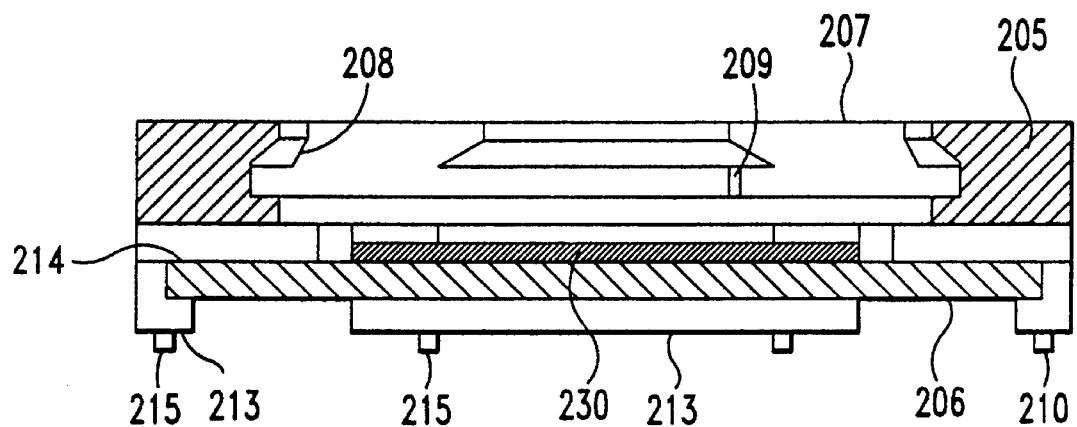
FIG. 18B shows a sectional view of a different embodiment of the body fixture.

FIG. 15 is a top view of another embodiment of a chip insertion and compression device also useful in the system and method of the invention, and FIG. 16 shows a sectional view of the device of FIG. 15 taken along the lines 16—16. FIG. 17 shows a top view of the lower body of the device of FIG. 15. FIGS. 18A and 18B show sectional views of variations of the lower body of FIG. 17 taken along the lines 18—18. FIG. 19 shows a top view of the lower heat sink of the device of FIG. 15. FIG. 20 shows a sectional view of the lower heat sink of FIG. 19 taken along the lines 20—20. FIG. 21 shows a top view of the body cover and internal gimbal thread of the device of FIG. 15. FIG. 22 shows a sectional view of the body cover and internal gimbal thread of FIG. 21 taken along the lines 22—22.

Referring to FIGS. 15 to 17, the alternate embodiment includes an upper heat sink 200 affixed by a plurality of screws 201 to a lower heat sink 202 securing therebetween a body cover 203, provided with a gimbal screw 204 which is in turn locked into a body fixture 205 carrying a chip 230 positioned on a burn in board or interposer 206.

The body fixture 205, shown in section and in greater detail in FIG. 18A, is generally square and has a circular central opening 207 having on its interior surface a plurality of beveled locking recesses 208 one of which is provided with a stop 209 in the form of a pin extending across one of the beveled recesses 208. The beveled locking recesses 208 are separated by receiving recesses 208a (FIG. 17). Located below the main portion of the body fixture there are, on three sides thereof, suspended a plurality of supports 210 for locating and, in conjunction with a locking plate 211 located on the fourth side thereof, holding the interposer 206 in a fixed position. The locking plate 211 is held on the fourth side of the body 205 by suitable screws 212. In FIG. 18B a variation of holding the interposer 206 in a fixed position is shown and comprises four locking plates 213 held on to the bottom 214 of the body fixture 205 by a series of screws 215.

The upper heat sink 200 is generally circular and, as noted previously, is affixed by a plurality of screws 201 to a generally circular lower heat sink 202 so that they securing therebetween a body cover 203 which can be locked into the body fixture 205. The upper heat sink is formed with a series of transverse slots 217 to form a plurality of vertical extended pillars 216. This creates a larger surface area for heat dissipation thus helping to maintain the chip at the desired temperature. Since the use of heat sinks is well known to the art, further discussion is unnecessary.

The lower heat sink 202 shown in FIGS. 19 and 20 is formed with four mesas or lands 219, on its upper surface an a single large land or mesa 229 on its lower surface. Each of the upper mesas 219 have a screw hole 201a therein, and are separated by channels 220 which form an X-shaped recess. In two of the channels 220 there is provided positioning pins 221. In the center of the X-shaped recess formed by the channels 220 there is provided a recess 222 in which there is positioned a circular, flat spring 223, shown in phantom, over which is positioned a bearing disc 224.

Referring to FIG. 21, the body cover 203 is generally in the form of a spoked wheel with a rim 225 supported by four spokes 226 forming an X. The rim 225 has an outer diameter that will fit within the opening 207 in the lower body fixture 205 and an inner diameter slightly larger than the outer diameter of the lower heat sink 202. In the center of the spokes 226 which there is a central, threaded opening 227 in which the gimbal screw 204 is positioned. In this embodiment this gimbal screw is preferably made out of a compatible non-oxidizing material capable of supplying a suitable force at temperatures encountered in burn-in testing, e.g., 120°–180° C. On the outside of the rim 225 and in line with each of the four spokes are extended locking ears 228. In two of the spokes there is provided locating holes 221a which mate with the positioning pins 221 in the lower heat sink 202.

To assemble the unit the body cover 203 is placed over the lower heat sink 202 so that the lower heat sink fits within the rim 225 and the spokes 226 fit into the channels 220 with the pins 221 being aligned with the hole 221a in the body cover spokes 226. When the body cover is properly aligned with the lower heat sink the upper mesas 219 loosely pass through corresponding openings 231 in the body cover 203. Since each of these lands 219 are provided with screw holes 201a the upper heat sink 200 is attached to the lower heat sink 202 by the screws 201. It should be noted that the body cover spokes 226 are slightly smaller, i.e., thinner in both height and width, than the lower heat sink channels 220 and thus the lands 219, of the lower heat sink extend above the upper surface of the body cover 203. Thus, when the heat sinks are secured together, the body cover is only loosely held therebetween.

The body fixture 205 is now provided with an interposer 206 and a chip 230 is placed thereon so that the contact pads on the chip are aligned with and are in contact with the contacts on the interposer as described in conjunction with FIG. 4. The heat sink body cover assembly, which includes the body cover 203 held therebetween, is now placed in the body fixture so that the body cover fits within the opening 207 and the ears 228 on the outer rim of the body cover fit into the recesses 208a. The heat sink body cover assembly is then turned clockwise so that the ears 228 on the body cover pass in to the beveled locking recess 208 until one of the ears abuts the pin 209. The fit between the ears 228 and the locking recesses 208a allows some play between the body cover 203 the body fixture 205. A circular wave spring 234 (FIG. 17) is positioned in recess 208 and is staked in place with pin 209 so as to prevent rotation of the spring. Spring 234 is sized and configured so that it contacts and biases upwardly the bottom surface of ears 228 of body cover 203. The spring force of wave spring 234 has a magnitude sufficient to drive body cover 203 upwardly against the upper wall of recess 208 with a force sufficient to substantially prevent lateral movement of cover 203 when the latter is loosened. In one embodiment, a spring force of 2–5 lbs, was found to be satisfactory. Once the body cover 203 is locked into the body fixture 205 it effectively becomes a gimbal ring for the joined upper and lower heat sinks. The gimbal screw 204 is now turned to force a ball bearing 204a (FIG. 16), located in its bottom center, against the bearing plate 224 which in turn bears against and compresses the flat spring 223 and forces the pedestal 202a (FIGS. 16 and 20) of the lower heat sink against the chip 230 further assuring that good electrical contact is made between the chip contacts and the contacts on the interposer 206. The gimbal screw 204, the ball bearing 204a, the bearing plate 224 and the flat spring 223 all co-act to assure that the fastened together upper and lower heats sinks have, around the body cover, sufficient gimballing action such that the bottom of pedestal 202a moves enough to become flat against the back of the chip 230 and apply an even pressure across the entire chip. This even pressure assures that a good electrical contact is made between all the chip contacts and interposer contacts.

If the chip, under test is one that is provided with projecting contacts, such as solder balls, when it becomes heated the projecting contacts may soften. Such softening can, unless continuous pressure is maintained between the chip contacts and the interposer contacts, cause the contacts to loosen with respect to each other, with good electrical contact therebetween after being lost. The flat spring 223 prevents such loosening and loss of electrical contact. Because the spring is compressed by the gimbal screw when the contacts soften or begin to loosen as result of heating, the spring begins to relax and expand and thus forces the bearing plate up against the ball bearing and the lower heat sink down against the chip. The compressed spring thus maintains adequate force between the chip and interposer contacts such that good electrical contact therebetween is maintained.

Once the chip is securely held in place by the gimbal screw being tightened down, the entire fixture and interposer is placed in the tester 161 where appropriate test conditions are applied to the chip. When the tests are completed the fixture and interposer is removed from the tester and the chip removed from the fixture.

Figure 23:
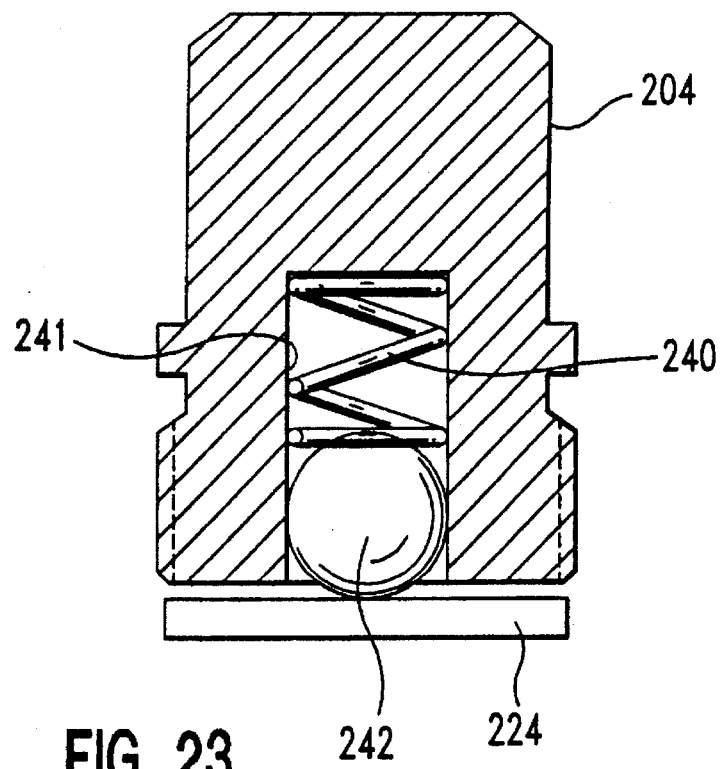
FIG. 23 shows an alternative embodiment of the gimbal screw of FIG. 21.

FIG. 23 shows an alternative embodiment of the gimbal screw 204 of FIG. 16. In this FIG. the gimbal screw 204 has an internal spring 240 contained in a central cavity 241. This spring 240 bears on a ball bearing 242 which in turn bears against a bearing plate 224 adapted for interacting with lower heat sink 202 and applying the continuous pressure needed to prevent change in the contacts during testing from interfering with the good electrical contact between the chip and the interposer contacts as described above in conjunction with FIGS. 15 to 22.

Leadless chips, i.e., those chip to be secured to a leadframe by wire bonding or TAB bonding, typically do not have solder balls or other contacts that extend any appreciable amount above the surface of the chip face, but rather have flat thin contact pads usually formed of aluminum or gold or the like. These leadless chips cannot be used with the interposer or burn in board arrangement as shown in FIG. 4. To contact such leadless chip the contacts on the interposer 246 must be provided with contacts that rise above its upper face so that a good electrical connection can be made to the chip contacts. Typically, such contacts are partially embedded in an insulator layer that prevents deformation, e.g., bending, of the contacts. Even if raised contacts are provided on the interposer surface, a leadless chip placed on the interposer can easily slip out of position if jostled prior to the heat sink body cover assembly being placed thereon and the gimbal screw being tightened down. To restrain the device from moving prior to clamping the chip on the interposer by the gimbal screw, a temporary hold down mechanism is needed.

The fixtures described above and illustrated in FIGS. 15–24 are designed so that the force applied to individual chip contacts (pads) fall within the range described above relative to the fixtures illustrated in FIGS. 7A, 7B, 8A and 8B, i.e., 10–50 grams per contact when dendrites are used as the contacts on interposer 206 and 5–25 grams per contact (pad) when wire contacts are used on the interposer.

Figure 24:
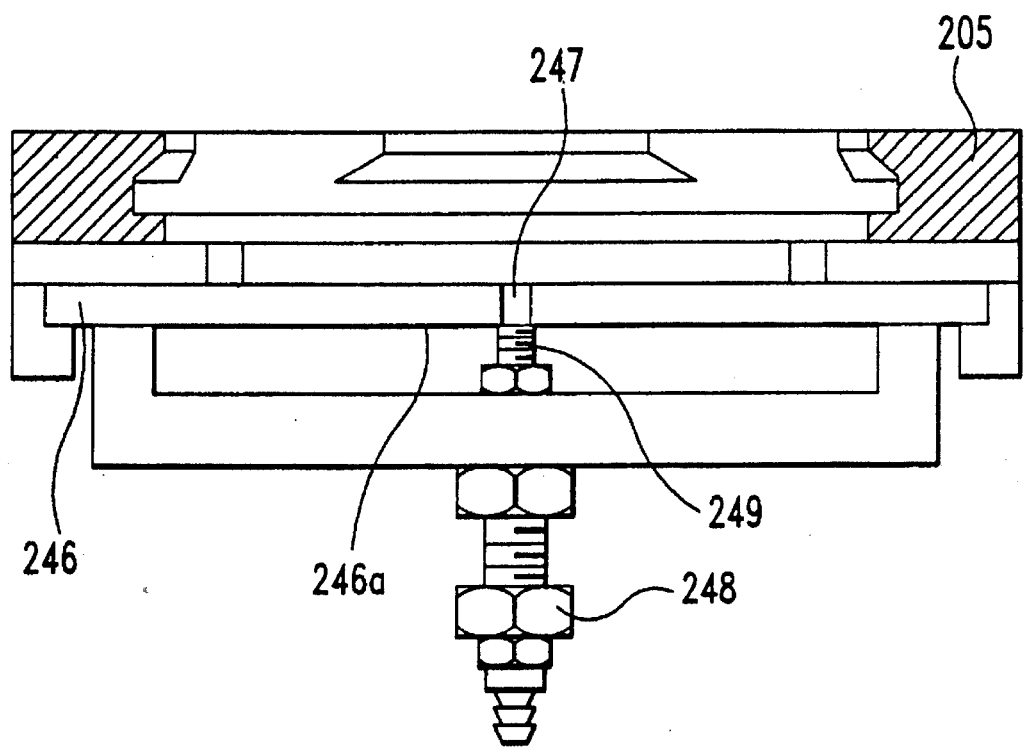
FIG. 24 shows a partial sectional view of the device of FIG. 15 modified for applying a vacuum to the chip for temporarily holding a leadless chip in the fixture of the invention.

FIG. 24 shows a vacuum based arrangement particularly adapted for temporarily holding such leadless chips in place until the gimbal screw can be tightened down on the chip. In particular FIG. 24 shows a sectional view of the body fixture 205 with a modified interposer 246 positioned therein. This interposer is provided with an opening 247 which is placed over and in line with a vacuum port adapter 248. The vacuum adapter 248 is provided with a soft tip 249 that makes a good seal with the bottom 246a of the interposer 246 and is coupled to a suitable vacuum source (not shown). When a chip is placed on the interposer 246 a vacuum is drawn and the chip is held firmly until the heat sink body cover assembly can be placed in the body fixture 205 and the gimbal screw tightened down. Once the gimbal screw is tightened down the vacuum is broken and the entire compressive force fixture is removed from the vacuum adaptor 248. Although this vacuum adapter is particularly useful when handling leadless chips it is also useful with any chip.

While the invention has been described with respect to certain preferred embodiments and exemplifications hereof, it is not intended to limit the scope of the invention thereby, but solely by the claims appended hereto.

What is claimed is:

1. A method of aligning and holding together contacts on a chip under test and corresponding surface contacts on an interposer to provide a highly electrically conductive but temporary bond therebetween, comprising the steps of:

providing an interposer having a plurality of contacts thereon;

placing said interposer on a body fixture for holding said interposer in a fixed position;

placing a chip having a plurality of contacts on said interposer so that the chip contacts are aligned with and contact corresponding interposer contacts;

placing an adjustable means having a flat bottom on said chip and positioning the bottom of the adjustable means flat against the back of the chip, and applying a controlled compressive force to said adjustable means to apply an even pressure across the entire back of said chip to electrically and temporarily bond each of said chip contacts to a corresponding one of said contacts on said interposer.

2. The method of claim 1 wherein there is further provided the step of applying signal inputs to the chip from said interposed across selected ones of said electrical bonds.

3. The method of claim 1 wherein there is further providing the steps of:

applying signal inputs to the chip across said electrical bonds; and recovering output signals from the chip across said electrical bonds.

4. The method of claim 1 wherein there is further provided the steps of:

temporarily holding said chip in a specified position on the surface of said interposer with a force of between 1 and 11 grams for each contact on said chip, and clamping said chip on said interposer in said position with a force of between 5 and 50 grams for each contact on said chip.

5. The method of claim 4 where the step of temporarily holding the chip includes the step of applying a vacuum between the chip and the interposer.

6. The method of claim 4 wherein there is further provided the step of testing of said chip by applying electrical signals through said interposer contacts to said chip.

7. The method of claim 4 wherein there is further provided the step of removing said chip from said interposer by applying (a) a vacuum to the surface of the chip remote from the interposer and a (b) positive pressure between the interposer and the chip.

* * * * *